(12) United States Patent
Harashima et al.

(10) Patent No.: US 10,689,759 B2
(45) Date of Patent: Jun. 23, 2020

(54) FILM FORMING APPARATUS

(71) Applicant: Tokyo Electron Limited, Tokyo (JP)

(72) Inventors: Masayuki Harashima, Yamanashi (JP); Hirokatsu Kobayashi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/184,173

(22) Filed: Nov. 8, 2018

(65) Prior Publication Data

US 2019/0071773 A1   Mar. 7, 2019

Related U.S. Application Data

(63) Continuation-in-part of application No. PCT/JP2017/016930, filed on Apr. 28, 2017.

(30) Foreign Application Priority Data

May 11, 2016 (JP) ................................. 2016-095417

(51) Int. Cl.

| | |
|---|---|
| *H01L 21/67* | (2006.01) |
| *C23C 16/458* | (2006.01) |
| *C23C 16/46* | (2006.01) |
| *H01L 21/205* | (2006.01) |
| *C23C 16/44* | (2006.01) |
| *C23C 16/32* | (2006.01) |

(Continued)

(52) U.S. Cl.
CPC ........ *C23C 16/4584* (2013.01); *C23C 16/325* (2013.01); *C23C 16/44* (2013.01); *C23C 16/46* (2013.01); *C30B 25/10* (2013.01); *C30B 25/12* (2013.01); *H01L 21/205* (2013.01); *C30B 29/36* (2013.01)

(58) Field of Classification Search
CPC ... C23C 16/325; C23C 16/4584; C23C 16/44; C23C 16/46; C30B 25/10; C30B 25/12; C30B 29/36; H01L 21/205
See application file for complete search history.

(56) References Cited

U.S. PATENT DOCUMENTS

2010/0055351 A1 * 3/2010 Kato ................. C23C 16/45521
427/595

FOREIGN PATENT DOCUMENTS

| JP | 2008-159944 A | 7/2008 |
|---|---|---|
| JP | 2012-178613 A | 9/2012 |

OTHER PUBLICATIONS

International Search Report dated Jun. 27, 2017 for WO 2017/195658 A1.

* cited by examiner

*Primary Examiner* — Yuechuan Yu
(74) *Attorney, Agent, or Firm* — Abelman, Frayne & Schwab

(57) ABSTRACT

A film forming apparatus includes a rotation shaft which is connected to a rotation stage. The rotation stage is accommodated in an inner space of a susceptor, holds a plurality of workpieces, and rotates the workpieces around the central axis. A gas flow along a direction orthogonal to the central axis from an outside of the rotation stage is formed in the susceptor. A wall portion of the susceptor facing a lower surface of the rotation stage includes an intermediate area defined by a first circle larger than a minimum distance between the central axis and the plurality of placing areas and a second circle smaller than a maximum distance between the central axis and the plurality of placing areas. One or more of through holes are formed in the intermediate area.

8 Claims, 7 Drawing Sheets

(51) Int. Cl.
*C30B 25/10* (2006.01)
*C30B 25/12* (2006.01)
*C30B 29/36* (2006.01)

FILM FORMING APPARATUS

CROSS-REFERENCE TO RELATED APPLICATIONS

This application is a Continuation-in-part of International Application No. PCT/JP2017/016930, filed on Apr. 28, 2017, which claims priority from Japanese Patent Application No. 2016-095417, filed on May 11, 2016, all of which are incorporated herein in their entireties by reference.

TECHNICAL FIELD

An embodiment of the present disclosure relates to a film forming apparatus.

BACKGROUND

In recent years, silicon carbide (SiC) has been used in an electronic device such as a semiconductor power device. In the manufacture of such an electronic device, a processing of forming an SiC film is performed on an SiC substrate by an epitaxial growth.

In the above-described processing, a semi-batch type film forming apparatus has been used in some cases, which has better throughput than a single sheet type film forming apparatus. The semi-batch type film forming apparatus is disclosed in, for example, Japanese Patent Laid-Open Publication Nos. 2008-159944 and 2012-178613.

The film forming apparatus disclosed in Japanese Patent Laid-Open Publication Nos. 2008-159944 and 2012-178613 includes a rotation shaft, a rotation stage, a susceptor, a container, a gas supply mechanism, and an induction heating mechanism. The rotation stage is provided on the rotation shaft, and supported by the rotation shaft. The rotation stage provides a plurality of placing areas. The plurality of placing areas are areas on which a plurality of workpieces are placed, and are disposed in a circumferential direction with respect to a central axis of the rotation shaft. The plurality of workpieces have a disc shape like a wafer. The susceptor has a rectangular tube shape, and accommodates the rotation stage in its inner space. The container accommodates the susceptor. The gas supply mechanism is configured to form a gas flow in a direction orthogonal to the rotation shaft from the outside of the rotation stage. The induction heating mechanism is provided on an outside of the container, and is provided with a coin wound around an outer circumference of the container. The susceptor is configured to be heated by induction heating.

SUMMARY

In an aspect, a semi-batch type film forming apparatus is provided. This film forming apparatus is provided with a rotation axis, a rotation stage, a susceptor, a gas supply mechanism, a container, and a heating mechanism. The rotation stage is provided on the rotation shaft, and fixed to the rotation shaft. The rotation stage is configured to hold a plurality of workpieces on a plurality of placing areas disposed in a circumferential direction with respect to a central axis of the rotation shaft. The plurality of placing areas are disposed in the circumferential direction with respect to the central axis of the rotation shaft, and are configured to hold the plurality of workpieces. In an embodiment, the workpiece has a disc shape, and each of the plurality of placing areas may have a circular shape corresponding to the shape of the workpiece. The susceptor provides a first opening and a second opening facing each other along a second direction that is orthogonal to a first direction parallel with the central axis, and provides an inner space between the first opening and the second opening so as to accommodate the rotation stage in the inner space. The gas supply mechanism is configured to form a gas flow from the first opening to the second opening through the inner space. The container is configured to accommodate the susceptor. The heating mechanism is provided around the container, and is configured to heat the susceptor.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
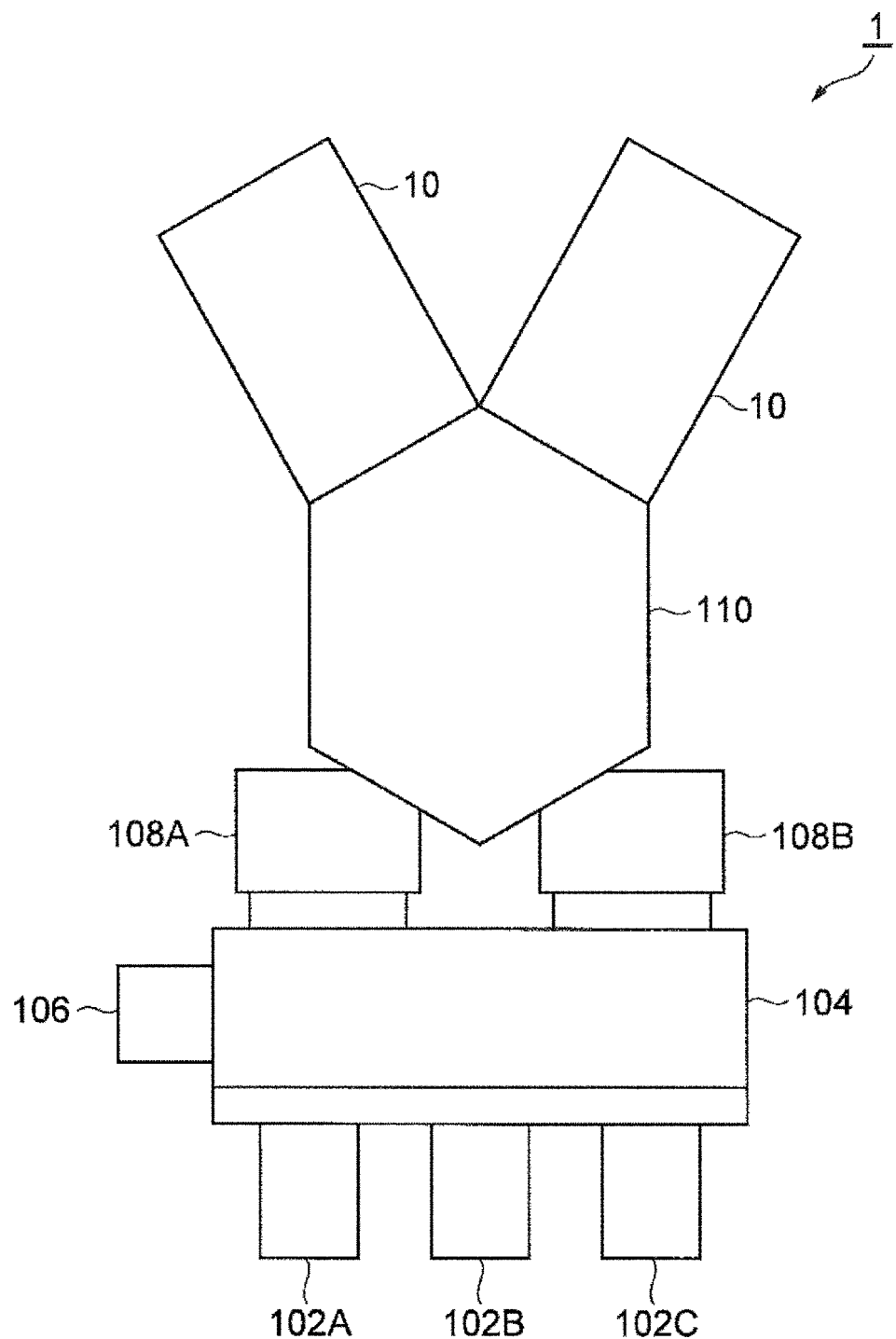
FIG. 1 is a view illustrating a film forming system according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In an epitaxial growth of SiC film, film forming is performed so as to introduce p-type or n-type impurities into the SiC film. In particular, in the case of p-type, the concentration of the impurities introduced into the SiC film is increased in an area where an in-plane temperature of a workpiece is low, and is decreased in an area where the temperature is high. Therefore, in order to suppress an in-plane fluctuation of the concentration of the impurities, it is required to reduce the in-plane fluctuation of the temperature of the workpiece. However, in a viewpoint of reducing the fluctuation of the temperature of the workpiece, further improvements are required in the above-described semi-batch type film forming apparatus in the related art.

In an aspect, a semi-batch type film forming apparatus is provided. This film forming apparatus is provided with a rotation axis, a rotation stage, a susceptor, a gas supply mechanism, a container, and a heating mechanism. The rotation stage is provided on the rotation shaft, and fixed to the rotation shaft. The rotation stage is configured to hold a plurality of workpieces on a plurality of placing areas disposed in a circumferential direction with respect to a central axis of the rotation shaft. The plurality of placing areas are disposed in the circumferential direction with respect to the central axis of the rotation shaft, and are configured to hold the plurality of workpieces. In an embodiment, the workpiece has a disc shape, and each of the plurality of placing areas may have a circular shape corresponding to the shape of the workpiece. The susceptor provides a first opening and a second opening facing each other along a second direction that is orthogonal to a first direction parallel with the central axis, and provides an inner space between the first opening and the second opening so as to accommodate the rotation stage in the inner space. The gas supply mechanism is configured to form a gas flow from the first opening to the second opening through the inner space. The container is configured to accommodate the susceptor. The heating mechanism is provided around the container, and is configured to heat the susceptor.

In the film forming apparatus according to an aspect, the susceptor includes a first wall portion and a second wall portion facing each other. The rotation stage is provided between the first wall portion and the second wall portion. The first wall portion faces the plurality of placing areas. A first through hole through which the rotation shaft passes is formed in the second wall portion. The second wall portion includes an intermediate area defined by a first circle having a first radius with respect to the central axis and a second circle having a second radius that is larger than the first radius with respect to the central axis. The first radius is larger than a minimum distance between the central axis and each of the plurality of placing areas, and the second radius is smaller than a maximum distance between the central axis and each of the plurality of the placing areas. One or more of second through holes are formed in the intermediate area.

In the film forming apparatus according to an aspect, the susceptor is heated, and radiant heat from the susceptor is transferred to the workpieces directly or via the rotation stage. Since the susceptor has the first through hole through which the rotation shaft passes, heat from the susceptor is difficult to be transferred to an area of the workpiece close to the first through hole, that is, to an area of the workpiece close to the central axis. Further, there is a tendency to deprive the heat of the area of the workpiece close to the central axis. Furthermore, since a gas is supplied from the first opening of the susceptor, there is a tendency to deprive the heat of an area of the workpiece passing through the vicinity of the first opening, that is, an area of the workpiece far from the central axis. In the film forming apparatus according to an aspect, since a second through hole is formed in the above-described intermediate area, the temperature of the intermediate area of the workpiece between the area close to the central axis and the area far from the central axis is lowered. Therefore, the in-plane fluctuation of the temperature of the workpiece is reduced.

In an embodiment, the heating mechanism is an induction heating mechanism having a coil wound around an outer circumference of the container. The second wall portion of the susceptor also includes an outer area extending from an outside of the intermediate area and an inner area extending from an inner side of the intermediate area. The intermediate area includes connection portions. The connection portions extend along a third direction that is orthogonal to the first direction and the second direction, and connect the outer area and the inner area. In the embodiment, an induction current flows along the third direction in the second wall portion of the susceptor. The induction current flows between the inner area and the outer area, through the connection portions extending along the third direction. Therefore, a density distribution of the induction current flowing through the second wall portion of the susceptor is controlled so that a radiant heat amount from the susceptor is adjusted. Thus, the rotation stage is uniformly heated.

In an embodiment, one or more of the second through holes have a longitudinal direction which coincides with the circumferential direction and may extend along the first circle and the second circle. Further, one or more of the second through holes may be circular through holes.

In an embodiment, the film forming apparatus may include an insulation material between the container and the susceptor so as to cover the susceptor. Further, in an embodiment, the film forming apparatus includes a holder mounted on the rotation stage, and the holder may provide a plurality of placing areas.

As described in the above, it is possible to reduce the in-plane fluctuation of the temperature of the workpiece in the semi-batch type film forming apparatus.

Hereinafter, various embodiments will be described in detail with reference to the drawings. In the respective drawings, the same or corresponding parts will be denoted by the same symbols.

First, a film forming system provided with a film forming apparatus according to an embodiment will be described. FIG. 1 is a view illustrating a film forming system according to an embodiment. The film forming system 1 illustrated in FIG. 1 is provided with ports 102A to 102C, a loader module 104, a positioning mechanism 106, loadlock modules 108A and 108B, a transfer module 110, and film forming apparatuses 10 according to an embodiment.

A holder (to be described later) is accommodated in each of the ports 102A to 102C. A plurality of workpieces are placed on the holder as described later. The ports 102A to 102C are connected to the loader module 104.

The loader module 104 provides a chamber and has a conveying device provided in the chamber. The conveying device of the loader module 104 takes out the holder accommodated in one of the ports 102A to 102C, and conveys the holder to one of the loadlock modules 108A and 108B. The holder may be sent to the positioning mechanism 106 before being conveyed to the loadlock module 108A or 108B, and the positioning of the holder may be performed by the positioning mechanism 106.

Each of the loadlock modules 108A and 108B provides a chamber for preliminary decompression. The holder conveyed by the conveying device of the loader module 104 is accommodated in one of the loadlock modules 108A and 108B.

The transfer module 110 is connected to the loadlock modules 108A and 108B. The transfer module 110 provides a chamber that is capable of being decompressed, and has a conveying device provided in the chamber. The conveying device of the transfer module 110 has a conveying arm. The conveying arm takes out the holder accommodated in the chamber of the loadlock module 108A or 108B, and conveys the holder to the film forming apparatus 10.

Figure 2:
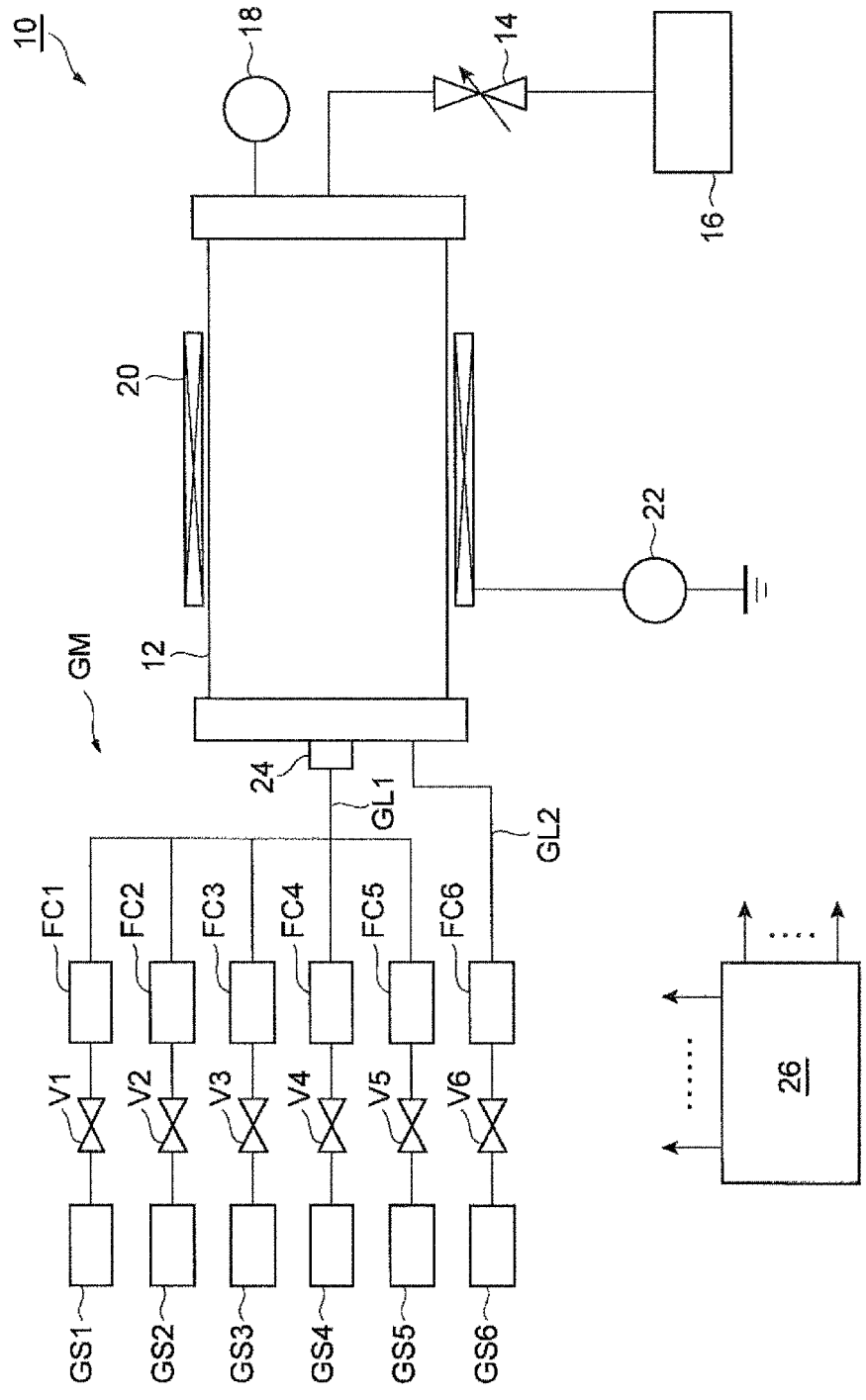
FIG. 2 is a schematic view illustrating a film forming apparatus according to an embodiment.

Hereinafter, the film forming apparatus 10 according to the embodiment will be described. FIG. 2 is a schematic view illustrating a film forming apparatus according to the embodiment. As illustrated in FIG. 2, the film forming apparatus 10 includes a container 12. The container 12 is a box-shaped container having an approximately rectangular parallelepiped outer shape, and provides a space S that is cable of being decompressed therein (see, e.g., FIG. 3).

The container 12 is connected with an exhaust device 16 via a pressure regulator 14. The exhaust device 16 is, for example, a vacuum pump. The space S in the container 12 is decompressed by the exhaust device 16. The gas supplied to an inner space of a susceptor (to be described later) is exhausted from the second opening of the susceptor. Further, a pressure gauge 18 is connected to the container 12. The pressure gauge 18 measures the pressure in the space in the container 12. The pressure regulator 14 is operated to adjust the pressure in the space in the container 12 based on the measured value of the pressure measured by the pressure gauge 18.

A coil 20 is wound around the outer circumference of the container 12. The coil 20 is connected to a high-frequency power supply 22. When a high frequency wave from the high-frequency power supply 22 is supplied to the coil 20, the susceptor (to be described later) is heated by the induced current. The coil 20 constitutes an induction heating mechanism which is a heating mechanism according to the embodiment. The heating mechanism is not limited to the induction heating mechanism, but may be any heating mechanism capable of heating the susceptor.

Further, the film forming apparatus 10 includes a gas supply mechanism GM. The gas supply mechanism GM includes valves V1 to V6, flow rate controllers FC1 to FC6, a gas line GL1, a gas line GL2, and a gas supplier 24. The valves V1 to V6 are connected to gas sources GS1 to GS6, respectively. The gas source GS1 is a source of a raw material gas containing silicon, for example, a source of $SiH_4$ gas. The gas source GS2 is a source of a carbon-containing gas, for example, a source of $C_3H_8$ gas. The gas source GS3 is a source of a carrier gas, for example, a source of $H_2$ gas. The gas source GS4 is a source containing p-type impurities, for example, a source of trimethylaluminum (TMA) gas. The gas source GS5 is a source containing n-type impurities, for example, a source of $N_2$ gas. The gas source GS6 is a source of a cooling gas, for example, a source of rare gas such as Ar gas.

The valves V1 to V6 are connected to the flow rate controllers FC1 to FC6, respectively. The flow rate controllers FC1 to FC6 are mass flow controllers or pressure-control type flow controllers. The flow rate controllers FC1 to FC5 are connected to the common gas line GL1, and the gas line GL1 is connected to the gas supplier 24. The gas supplier 24 supplies a gas to a space S1 for film formation (to be described later) (see, e.g., FIG. 3) of the space S provided by the container 12. The flow rate controller FC6 is connected to the gas line GL2, and the gas line GL2 supplies a cooling gas to a space S2 (to be described later) (see, e.g., FIG. 3) of the space S provided by the container 12.

Further, the film forming apparatus 10 may include a controller 26. The controller 26 may include a processor such as a CPU, a storage device, an input device such as a keyboard, a display unit, and a communication device. A program for controlling each part of the film forming apparatus 10 in each step of the film forming processing executed in the film forming apparatus 10, that is, a recipe is stored in the storage device. The CPU is operated according to the program, and outputs a control signal to each part of the film forming apparatus 10 via the communication device. By the operation of the controller 26, for example, the valves V1 to V6, the flow rate controllers FC1 to FC6, the high-frequency power supply 22, the pressure regulator 14, and the exhaust device 16 are controlled. Further, a driving device for the rotation stage (to be described later) is controlled as well.

Figure 3:
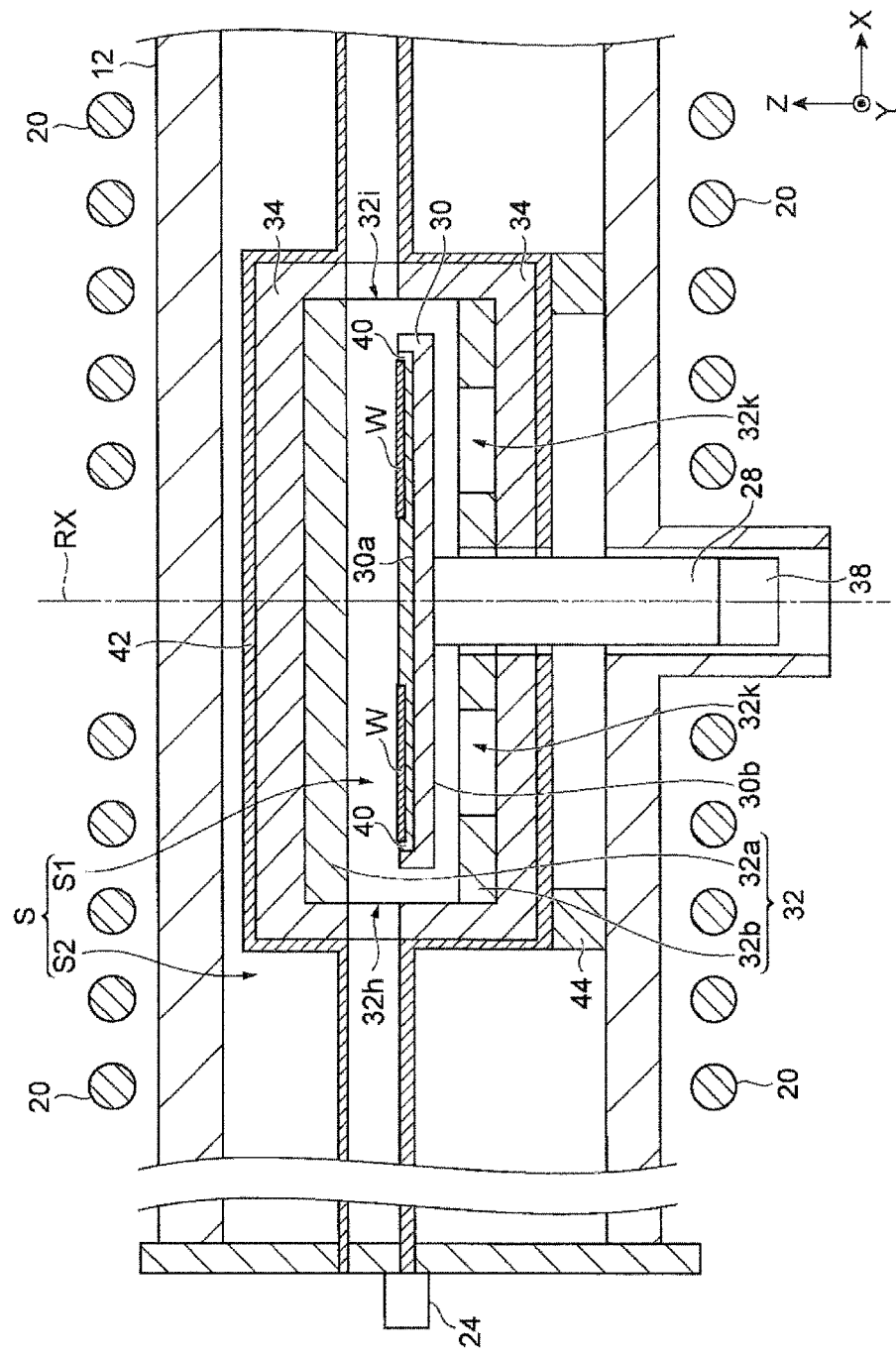
FIG. 3 is a cross-sectional view illustrating an inner structure of the film forming apparatus illustrated in FIG. 2.

Hereinafter, an inner structure of the container 12 of the film forming apparatus 10 will be described with reference to FIG. 3. FIG. 3 is a cross-sectional view illustrating an inner structure of the film forming apparatus illustrated in FIG. 2. As illustrated in FIG. 3, the film forming apparatus 10 further includes a rotation shaft 28, a rotation stage 30, and a susceptor 32. Further, in the embodiment, the film forming apparatus 10 may be provided with an insulation material 34.

In the embodiment, the rotation shaft 28 has an approximately cylindrical shape, and extends in a first direction Z (a vertical direction). The first direction Z is a direction that is parallel to a central axis of the rotation shaft 28. The rotation stage 30 is provided on the rotation shaft 28, and fixed to the rotation shaft 28. The rotation stage 30 holds a plurality of workpieces W on a plurality of placing areas 40a (see, e.g., FIG. 4) (to be described later). Further, the rotation stage 30 is configured to rotate the plurality of workpieces W around the central axis RX. The workpiece W has, for example, a disc shape like a wafer.

In the embodiment, the rotation stage 30 has an approximately disc shape. The rotation stage 30 may be, for example, a graphite member coated with SiC, or a polycrystalline SiC member. In the embodiment, the rotation stage 30 has a first surface 30a and a second surface 30b. The first surface 30a and the second surface 30b face each other. The first surface 30a is an upper side surface of the rotation stage 30, and the second surface 30b is a lower side surface of the rotation stage 30. The rotation shaft 28 extends from the lower side of the second surface 30b of the rotation stage 30, and is connected to a central portion of the rotation stage 30. The rotation shaft 28 is connected to a driving device 38. The driving device 38 generates power for rotating the rotation shaft 28 around the central axis RX, thereby rotating the rotation stage 30 around the central axis RX.

Figure 4:
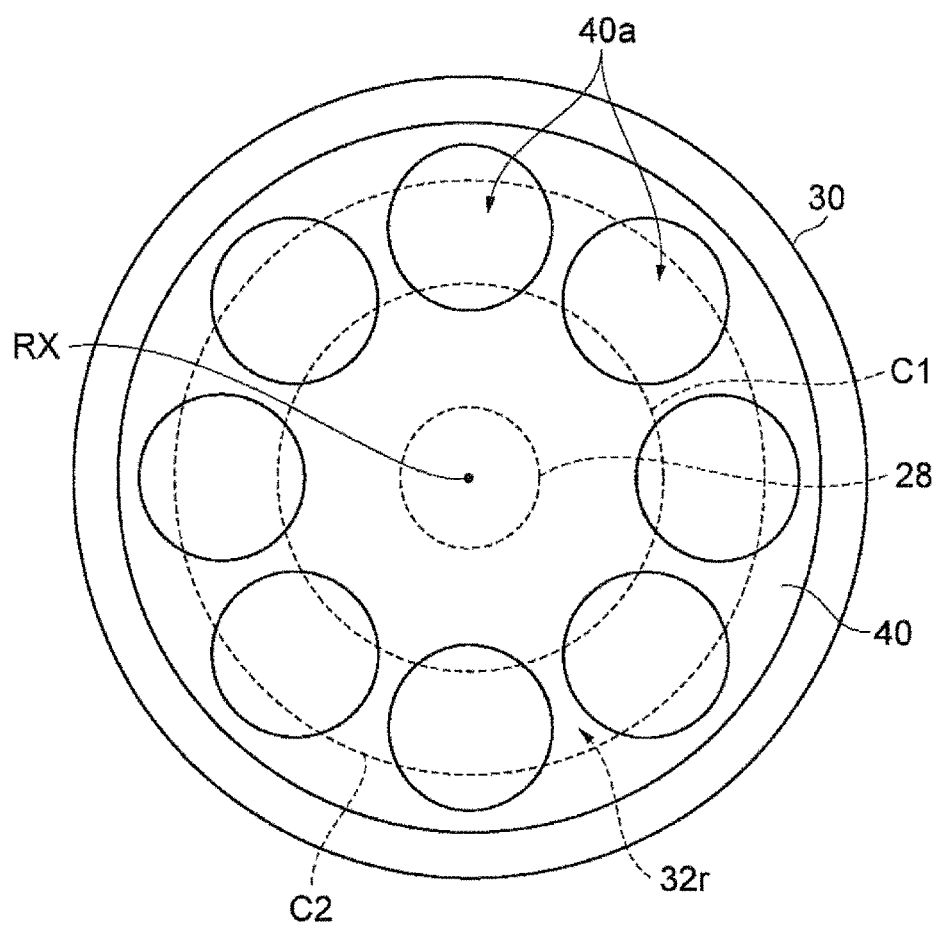
FIG. 4 is a plan view illustrating a holder and a rotation stage illustrated in FIG. 3.
Figure 4:
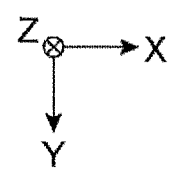

The plurality of workpieces W are held on the first surface 30a. In the embodiment, the plurality of workpieces W are placed on a holder 40, and the holder 40 is mounted on the rotation stage 30. FIG. 4 is a plan view illustrating the holder and the rotation stage illustrated in FIG. 3 as viewed from above. As illustrated in FIG. 3 and FIG. 4, the holder 40 is a member having an approximately disc shape. The holder 40 may be, for example, a graphite member coated with SiC, or a polycrystalline SiC member. In the embodiment, a recess is defined on the first surface 30a of the rotation stage 30. The recess has a circular planar shape around the central axis RX. The holder 40 is fitted into the recess.

The upper surface of the holder 40 provides a plurality of placing areas 40a. The plurality of placing areas 40a are areas on which the plurality of workpieces W are placed respectively. The plurality of placing areas 40a are disposed in the circumferential direction with respect to the center of the holder 40, that is, the central axis RX. Therefore, in a state where the holder 40 is placed on the rotation stage 30, the plurality of placing areas 40a and the workpieces W are disposed in parallel in the circumferential direction with respect to the central axis RX. In FIG. 4, the number of placing areas 40a is 8, but the number of placing area 40a may be an arbitrary number of 2 or more.

In the embodiment, each of the plurality of placing areas 40a may be a surface of the holder defining the recess. The recess has a shape corresponding to the shape of the workpiece W. For example, the recess has a circular planar shape having a diameter slightly larger than that of the workpiece W. In the embodiment, the plurality of workpieces W are respectively fitted into the recess provided by the holder 40, and placed on the plurality of placing areas 40a. The plurality of workpieces W held by the rotation stage 30 in this manner are rotated in the circumferential direction with respect to the central axis RX during film formation, by the rotation of the rotation stage 30 involved by the rotation of the rotation shaft 28.

Figure 5:
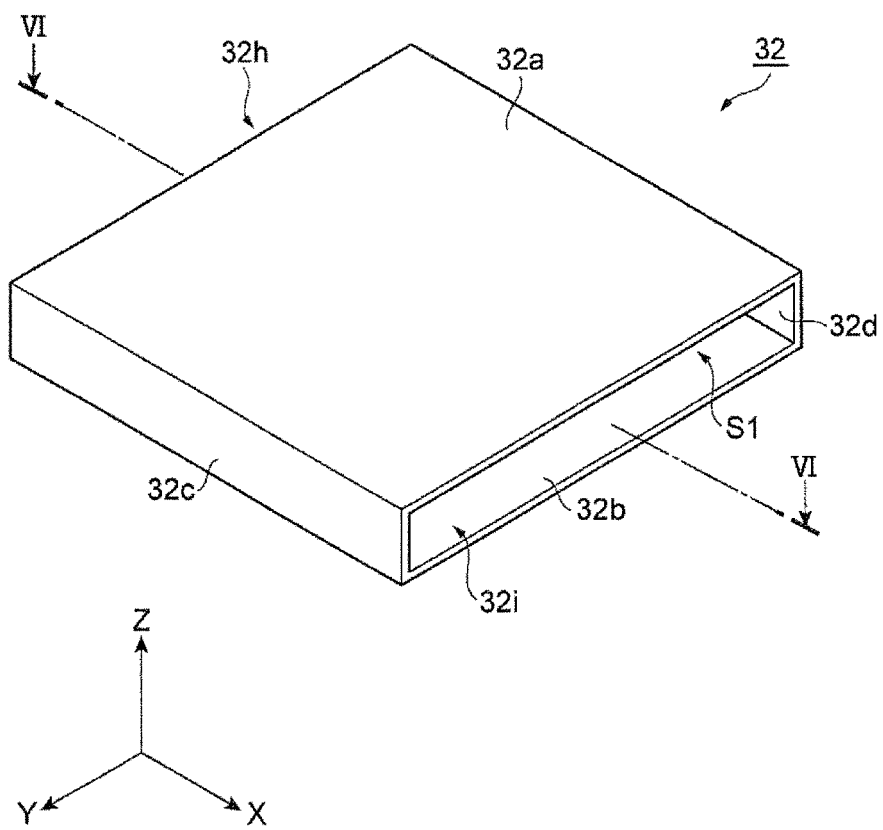
FIG. 5 is a perspective view illustrating a susceptor illustrated in FIG. 3.

The rotation stage 30 is accommodated in an inner space of the susceptor 32, that is, the film forming space S1 provided by the susceptor 32. FIG. 5 is a perspective view illustrating the susceptor illustrated in FIG. 3. The susceptor 32 is a member that provides a first opening 32h, a second opening 32i, and the space S1. The susceptor 32 has, for example, an approximately rectangular tube shape. The first opening 32h and the second opening 32i face each other along a second direction orthogonal to the first direction Z. The space S1 is a space between the first opening 32h and the second opening 32i. The susceptor 32 is, for example, a graphite member coated with SiC.

In the embodiment, the susceptor 32 includes a first wall portion 32a, a second wall portion 32b, a third wall portion 32c, and a fourth wall portion 32d. The first wall portion 32a and the second wall portion 32b have an approximately flat plate shape, and face each other along the Z direction. The rotation stage 30 is provided between the first wall portion 32a and the second wall portion 32b. The first wall portion 32a extends above the rotation stage 30, and faces the first surface 30a. The second wall portion 32b extends below the rotation stage 30, and faces the second surface 30b. The third wall portion 32c and the fourth wall portion 32d face each other, and extend in a direction intersecting with the first wall portion 32a and the second wall portion 32b so as to be connected to both edges of each of the first wall portion 32a and the second wall portion 32b.

The susceptor 32 is heated by induction heating by the coil 20. When the susceptor 32 is heated, the rotation stage 30, the holder 40, and the plurality of workpieces W are heated by, for example, radiation from the susceptor 32. That is, the susceptor 32 is configured to heat the rotation stage 30, the holder 40, and the plurality of workpieces W from the four surfaces.

The susceptor 32 is covered with an insulation material 34. In the embodiment, the insulation material 34 has an approximately box-like shape extending along the outer surface of the susceptor 32, and provides two openings that are respectively continued to the first opening 32h and the second opening 32i of the susceptor 32 at both ends in the second direction X. The insulation material 34 has a thermal conductivity lower than that of the susceptor 32. For example, the insulation material 34 may be constituted by graphite. Meanwhile, the density of the carbon material that constitutes the insulation material 34 is lower than that of carbon material that constitutes the susceptor 32. Therefore, the insulation material 34 may be constituted by, for example, carbon fiber. The insulation material 34 is interposed between the susceptor 32 and the container 12 to hinder the transfer of the heat from the susceptor 32 to the container 12, and transfer the heat of the susceptor 32 to the rotation stage 30, the holder 40, and the plurality of workpieces W. Therefore, it is possible to heat the workpieces W with high efficiency.

The insulation material 34 is covered with a holding member 42. That is, the holding member 42 provides a space for accommodating the rotation stage 30, the susceptor 32, and the insulation material 34. The space extends along the second direction X. Further, the holding member 42 is opened at both ends in the second direction X, and further provides a path leading to the space S1. The holding member 42 may be constituted by, for example, quartz. The holding member 42 is supported on the inner surface of the container 12 via a columnar support portion 44. The above-described space S2 is formed between the holding member 42 and the container 12. The cooling gas is supplied to the space S2 as described above.

Further, the above-described gas supplier 24 is provided at one opening end in the second direction X of the holding member 42. The gas supplier 24 forms a gas flow toward the second direction X in the film forming space S1. That is, the gas supplier 24 forms a gas flow from the first opening 32h through the space S1 to the second opening 32i. In other words, the gas supplier 24 forms a gas flow along a film forming surface of the plurality of workpieces W from the outside of the rotation stage 30. In the embodiment, the gas supplier 24 provides a plurality of gas discharge outlets disposed along a third direction Y orthogonal to the first direction Z and the second direction X. As illustrated in FIG. 3, the gas supplier 24 is arranged to face a lower portion of the opening provided by the holding member 42. An upper portion of the opening is configured as an area through which, when the holder 40 is conveyed in the space S1, the conveying arm of the transfer module 110 described above passes.

Figure 6:
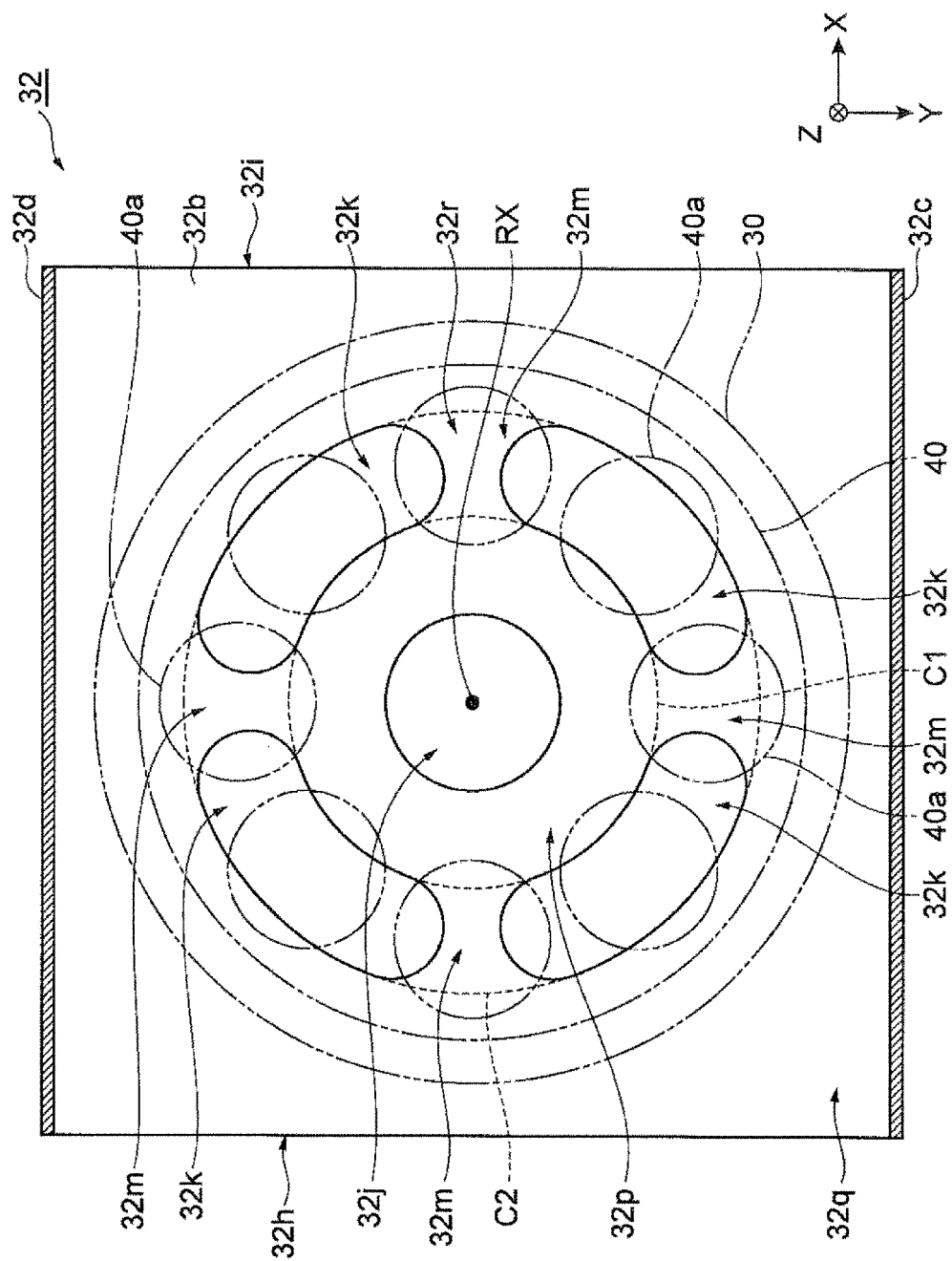
FIG. 6 is a cross-sectional view illustrating the susceptor taken along line VI-VI of FIG. 5.

Hereinafter, further details of the susceptor 32 will be described with reference to FIG. 3 and FIG. 6 together. FIG. 6 is a cross-sectional view illustrating the susceptor taken along a line VI-VI of FIG. 5. A first through hole 32j through which the rotation shaft 28 passes is formed in the second wall portion 32b of the susceptor 32. Further, the second wall portion 32b includes an intermediate area 32r, an inner area 32p, and an outer area 32q.

The intermediate area 32r is an area defined by a first circle C1 and a second circle C2. The first circle C1 is a circle having a first radius with respect to the central axis RX, and the second circle C2 is a circle having a second radius larger than the first radius. The first radius is larger than a minimum distance between each of the plurality of placing areas 40a and the central axis RX, and the second radius is smaller than a maximum distance between each of the plurality of placing areas 40a and the central axis RX. That is, the first radius is larger than a radius of an inscribed circle of the plurality of placing areas 40a, and the second radius is smaller than a circumscribed circle of the plurality of placing areas 40b. The inner area 32p is an inner area of the intermediate area 32r. The above-described first circle C1 is a border of the intermediate area 32r and the inner area 32p. Further, the outer area 32q is an outer area of the intermediate area 32r. The above-described second circle C2 is a border of the intermediate area 32r and the outer area 32q.

One or more of second through holes 32k are formed in the intermediate area 32r. In the embodiment, one or more of the second through holes 32k are elongated holes having a longitudinal direction which coincides with the circumferential direction, and extend along the first circle C1 and the second circle C2. In the example illustrated in FIG. 6, four second through holes 32k are formed in the intermediate area 32r, but the number of the second through hole 32k may be an arbitrary number of 1 or more.

In the embodiment, the intermediate area 32r has connection portions 32m. The connection portions 32m are portions where the second through hole 32k is not formed in the intermediate area 32r, and connect the inner area 32p and the outer area 32q. The connection portions 32m extend along the third direction Y between at least the inner area 32p and the outer area 32q. That is, the second through holes 32k are formed at both ends in the second direction X of the connection portion 32m extending in the third direction Y. The above-described coil 20 extends so as to circle around the outside of the first wall portion to the fourth wall portion of the susceptor 32. Therefore, in the second wall portion 32b of the susceptor 32, the induced current flows along the third direction Y, and flows between the inner area and the outer area via the connection portion 32m. Therefore, a density distribution of the induced current flowing through the second wall portion 32b of the susceptor 32 is controlled, and a radiant heat amount from the susceptor 32 is adjusted. Thus, the rotation stage 30 and the holder 40 are uniformly heated.

In the film forming apparatus 10, when epitaxially growing SiC on the workpiece W, the rotation stage 30 holding the plurality of workpieces W are rotated. Further, the susceptor 32 is heated by the induction heating by the coil 20, and radiant heat from the susceptor 32 is transferred to the plurality of workpieces W directly or via the rotation stage 30. Therefore, the plurality of workpieces W are heated. The plurality of workpieces W are heated to a temperature of, for example, approximately 1600° C. Further, a gas is supplied from the gas supplier 24 of the gas supply mechanism GM along the second direction X in the space S1. The gas includes, for example, $SiH_4$ gas, $C_3H_8$ gas, and $H_2$ gas. Further, when introducing p-type impurities to an epitaxial growth film, the gas may further include, for example, TMA gas. Alternatively, when introducing p-type impurities to the epitaxial growth film, the gas may further include, for example, $N_2$ gas. The epitaxial growth film of SiC is formed on the workpiece W by such a film forming processing.

In the film forming apparatus 10, the first through hole 32j through which the rotation shaft 28 passes is formed in the susceptor 32. Thus, the heat from the susceptor 32 is difficult to transfer to the area of the workpiece W close to the first through hole 32j, that is, the area of the workpiece W close to the central axis RX. Further, there is a tendency to deprive the heat of the area of the workpiece W close to the central axis RX. Furthermore, since a gas is supplied from the first opening 32h of the susceptor 32, there is a tendency to deprive the heat of the area of the workpiece W passing through the vicinity of the first opening 32h, that is, the area of the workpiece W far from the central axis RX. In the film forming apparatus 10, the second through hole 32k is formed in the above-described intermediate area 32r. Thus, a temperature of an intermediate area of the workpiece W between the area close to the central axis RX and the area far from the central axis RX is lowered. Therefore, the in-plane fluctuation of the temperature of the workpiece W is reduced.

When the in-plane fluctuation of the temperature of the workpiece W is reduced, the in-plane fluctuation of the concentration of the impurities introduced into the film during SiC epitaxial growth is reduced. Meanwhile, when the in-plane fluctuation of the temperature of the workpiece W is generated, defects such as triangular defects due to abnormal nucleation may occur in a low temperature area in the workpiece W. According to the film forming apparatus 10, the occurrence of such defects is also suppressed since the in-plane fluctuation of the temperature of the workpiece W is reduced.

Figure 7:
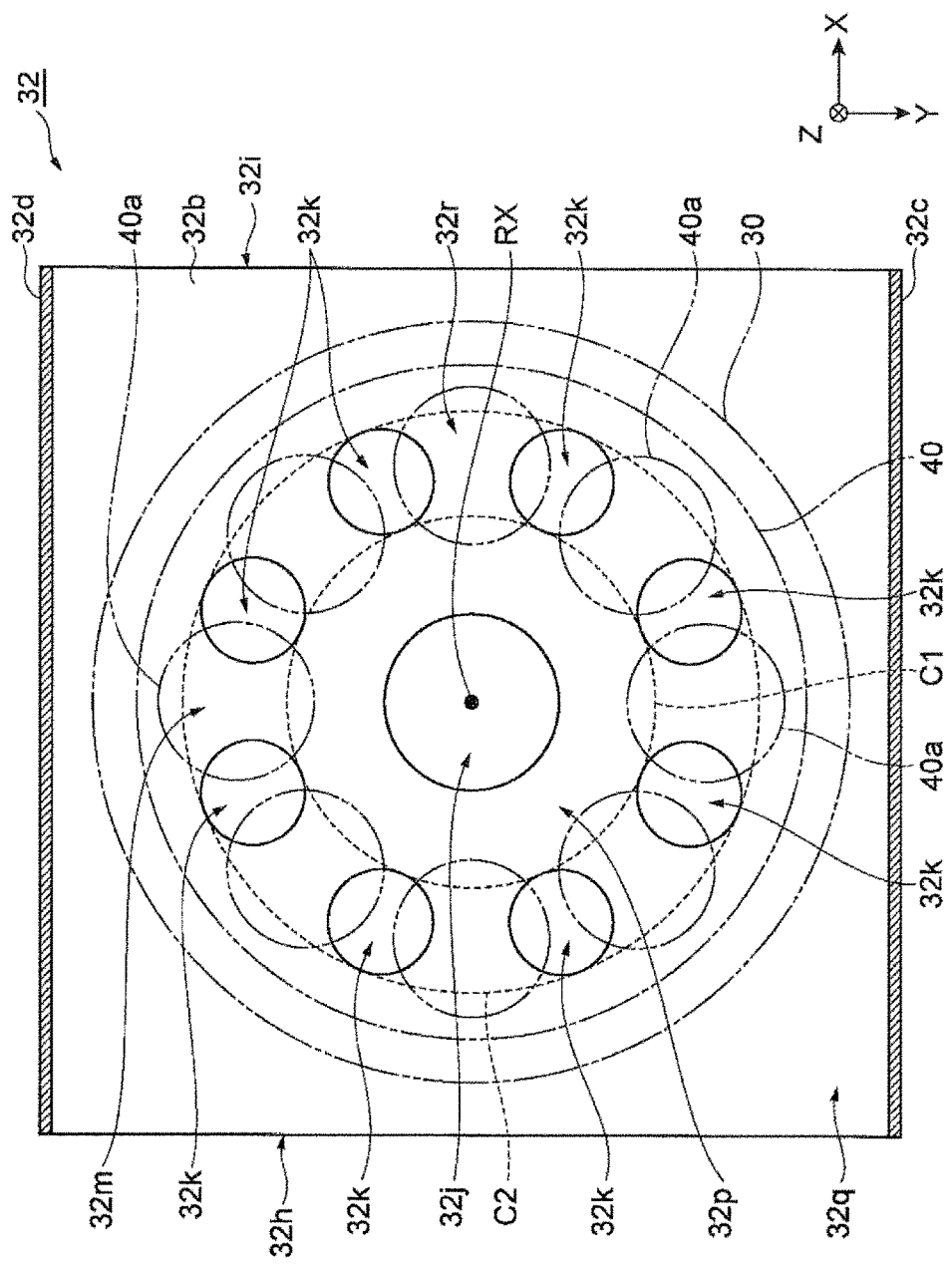
FIG. 7 is a cross-sectional view illustrating a susceptor according to another embodiment.

While various embodiments have been described in the above, various modifications may be made without being limited to the above-described embodiments. FIG. 7 is a cross-sectional view illustrating a susceptor according to another embodiment. In the susceptor 32 illustrated in FIG. 7, the second through hole 32k has a circular planar shape. In this manner, the shape of the second through hole 32k formed in the intermediate area 32r of the second wall portion 32b of the susceptor 32 may have an arbitrary shape.

In the foregoing, the embodiment has been described with the principle of the present disclosure, but those skilled in the art recognizes that the present disclosure may be changed in disposition and details without departing from the principle. The present disclosure is not limited to the specific configurations disclosed in the present embodiment. Accordingly, all modifications and changes in the claims and the scope of the spirit of the claims are claimed.

What is claimed is:
1. A film forming apparatus comprising:
a rotation shaft;
a rotation stage provided on the rotation shaft, fixed to the rotation shaft, and configured to hold a plurality of workpieces on a plurality of placing areas disposed in a circumferential direction with respect to a central axis of the rotation shaft;
a susceptor configured to provide a first opening and a second opening to face each other along a second direction that is orthogonal to a first direction parallel with the central axis, and provide an inner space between the first opening and the second opening so as to accommodate the rotation stage therein;
a gas supply mechanism configured to form a gas flow from the first opening to the second opening through the inner space;
a container configured to accommodate the susceptor; and
a heating mechanism provided around the container and configured to heat the susceptor,
wherein the susceptor includes a first wall portion and a second wall portion facing each other,
the rotation stage is provided between the first wall portion and the second wall portion,
the first wall portion faces the plurality of placing areas,
a first through hole through which the rotation shaft passes is formed in the second wall portion,
the second wall portion includes an intermediate area defined by a first circle having a first radius with respect to the central axis and a second circle having a second radius that is larger than the first radius with respect to the central axis, and the first radius is larger than a minimum distance between the central axis and each of the plurality of placing areas and the second radius is smaller than a maximum distance between the central axis and each of the plurality of the placing areas,
wherein the film forming apparatus further comprises an insulation layer provided between the container and the susceptor so as to enclose the susceptor,
one or more of second through holes are formed in the intermediate area, and
the one or more of second through holes are covered with the insulation layer.
2. The film forming apparatus of claim 1, wherein the heating mechanism is an induction heating mechanism having a coil wound around an outer circumference of the container,
the second wall portion further includes an outer area extending from an outside of the intermediate area and an inner area extending from an inner side of the intermediate area,
the intermediate area includes a connection portion extending along a third direction that is orthogonal to the first direction and the second direction and configured to connect the outer area and the inner area.
3. The film forming apparatus of claim 1, wherein one or more of the second through holes have a longitudinal direction that coincides with the circumferential direction, and extend along the first circle and the second circle.

4. The film forming apparatus of claim 1, wherein the insulation layer comprises an insulation material and is provided between the container and the susceptor so as to cover the susceptor.

5. The film forming apparatus of claim 1, further comprising a holder mounted on the rotation stage, wherein the holder provides the plurality of placing areas.

6. The film forming apparatus of claim 1, wherein the insulation layer does not have a hole below the intermediate area.

7. The film forming apparatus of claim 1, wherein the insulation material comprises graphite.

8. The film forming apparatus of claim 1, wherein the container does not have a hole at a location corresponding to any of the one or more of second through holes.

* * * * *